(12) United States Patent
Chang et al.

(10) Patent No.: US 11,570,886 B1
(45) Date of Patent: Jan. 31, 2023

(54) CIRCUIT BOARD DEVICE

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Yu-Ju Chang, Hsinchu (TW); Ding-Kang Shen, Hsinchu (TW); Yun-Jia Li, Hsinchu (TW); Jia-Liang Chen, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/652,095

(22) Filed: Feb. 22, 2022

(30) Foreign Application Priority Data

Dec. 30, 2021 (TW) .................................. 110149767

(51) Int. Cl.
*H05K 1/02* (2006.01)
(52) U.S. Cl.
CPC ......... *H05K 1/0225* (2013.01); *H05K 1/0245* (2013.01); *H05K 2201/09509* (2013.01); *H05K 2201/09609* (2013.01)

(58) Field of Classification Search
CPC ... H05K 1/0224; H05K 1/0225; H05K 1/0227
See application file for complete search history.

(56) References Cited

FOREIGN PATENT DOCUMENTS

TW I586034 B 6/2017

*Primary Examiner* — Jeremy C Norris
(74) *Attorney, Agent, or Firm* — CKC & Partners Co., LLC

(57) ABSTRACT

A circuit board device includes a multilayer structure, a main ground area and a circuit module. The multilayer structure includes a plurality of plates. The main ground area is arranged in the multilayer structure. The circuit module includes a differential signal circuit and a surrounding circuit module. The differential signal circuit is located in the multilayer structure, and includes a positive signal pad and a negative signal pad. The positive signal pad is located on a configuration surface of one of the plates. The negative signal pad is located on the disposition surface, and is separated from the positive signal pad. The surrounding circuit module is located on the disposition surface, and electrically connected to the main ground area. The surrounding circuit module surrounds the positive signal pad and the negative signal pad in an enclosing way, and is physically separated from the differential signal circuit.

12 Claims, 9 Drawing Sheets

CIRCUIT BOARD DEVICE

RELATED APPLICATIONS

This application claims priority to Taiwan Application Serial Number 110149767, filed on Dec. 30, 2021, which is herein incorporated by reference.

BACKGROUND

Field of Disclosure

The present disclosure relates to a circuit board device. More particularly, the present disclosure relates to a circuit board device with a differential signal circuit.

Description of Related Art

In general, a substrate structure of a conventional semiconductor device is formed by plates which are stacked together, and the plates are formed with circuit patterns and via portions thereon. The respective circuit patterns of the plates are electrically connected to each other through the via portions, and electrically connected to other electrical elements on the same plate through contacts of the via portions.

However, when the semiconductor device is designed to be increased in size, a problem of substrate warpage to the semiconductor device may rise. When the semiconductor device is designed to be increased in thickness, the substrate structure thereof may cause the signal resonance point during operation to move to a lower resonance frequency, which is easier to cause input loss and loop loss failures, thereby affecting the signal performance of the signal path It is noted that the above-mentioned technology obviously still has inconvenience and defects, and needs to be further improved. Therefore, how to develop a solution to improve the foregoing deficiencies and inconvenience is an important issue that relevant persons engaged in the industry are currently unable to delay.

SUMMARY

One aspect of the present disclosure is to provide a circuit board device to solve the aforementioned problems of the prior art.

In one embodiment of the present disclosure, a circuit board device is provided, and the circuit board device includes a multilayer structure, a main ground area and a circuit module. The multilayer structure includes a plurality of plates stacked with each other. The main ground area is arranged in the multilayer structure. The circuit module includes a differential signal circuit and a surrounding circuit module. The differential signal circuit is located in the multilayer structure, and includes a positive signal portion having a positive signal pad, and a negative signal portion having a negative signal pad. The positive signal pad is located on a disposition surface of one of the plates, and the negative signal pad is located on the disposition surface, and separated from the positive signal pad. The surrounding circuit module is electrically connected to the main ground area, located on the disposition surface to surround the positive signal pad and the negative signal pad in an enclosing way. The surrounding circuit module is physically separated from the differential signal circuit.

Thus, through the construction of the embodiments above, even if the thickness of the plates of the circuit board device in the disclosure is increased, input loss and loop loss failures of the signals still can be maintained or improved, thereby enhancing the signal performance of the signal channel.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
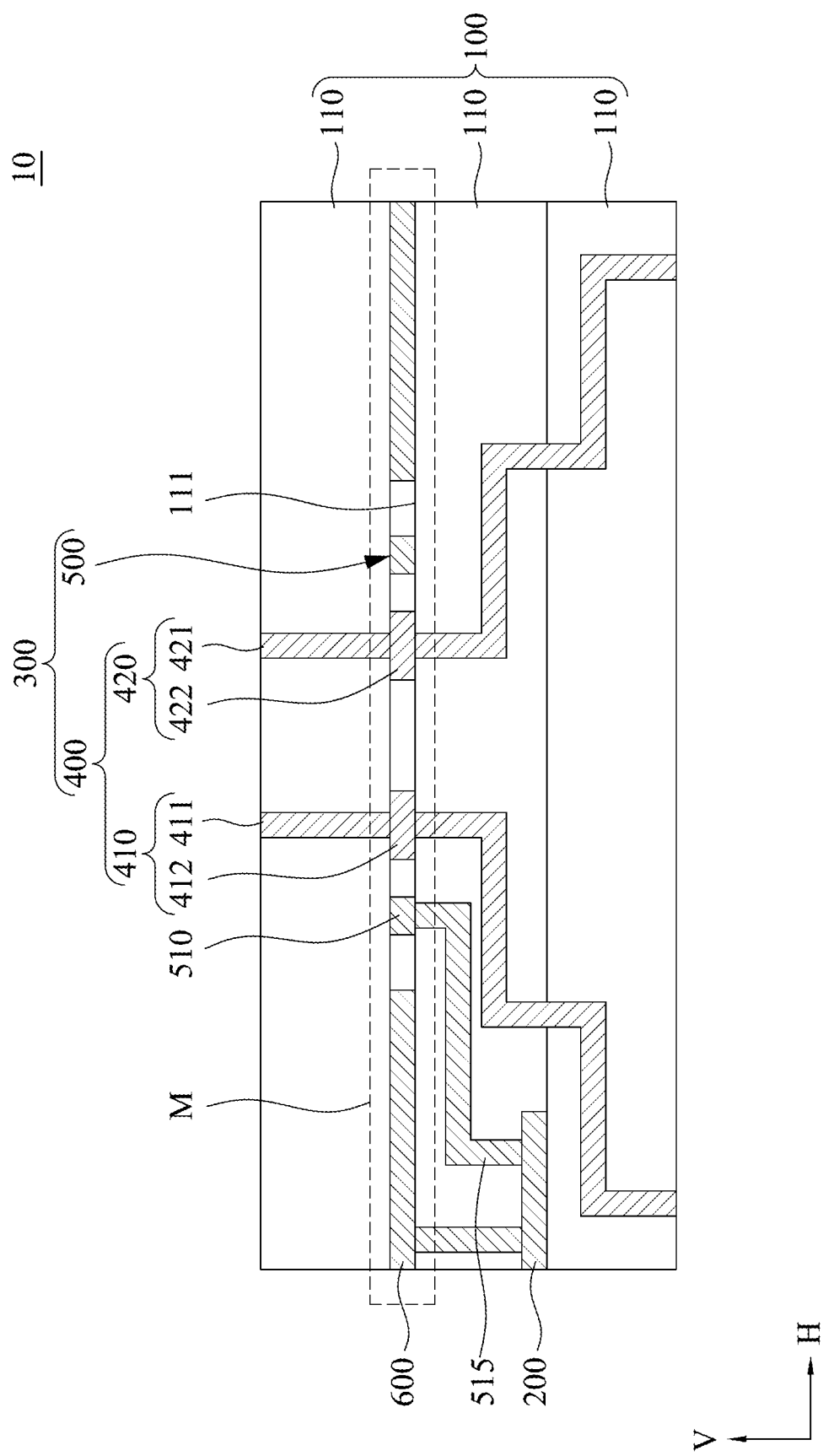
FIG. 1 is a side view of a circuit board device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
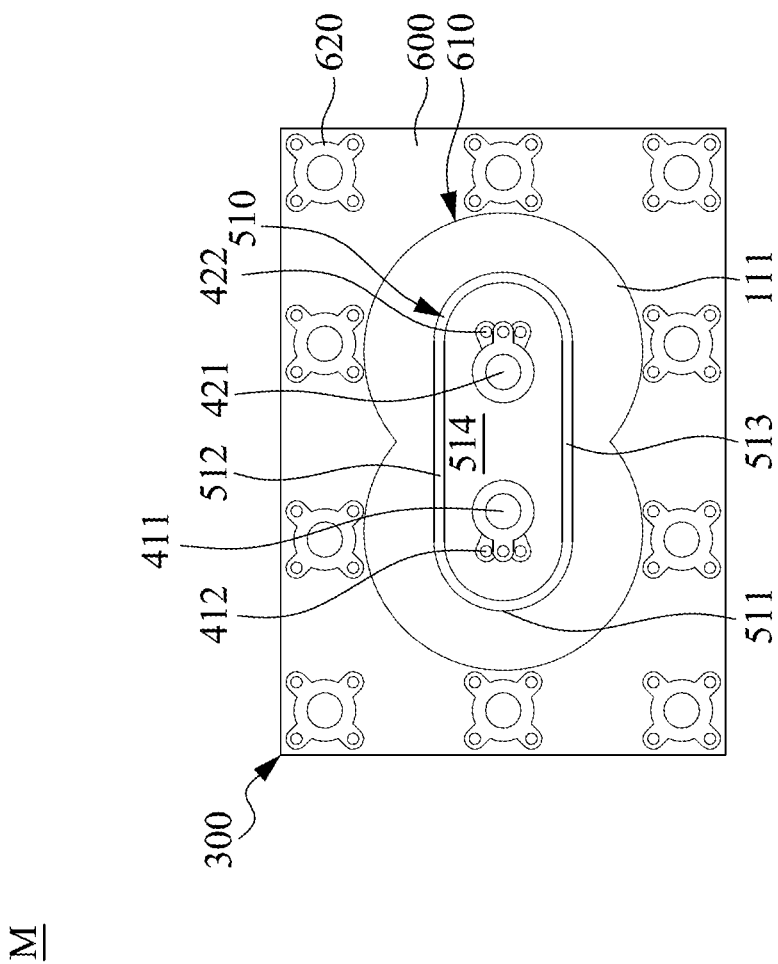
FIG. 2 is a top view of an area M of FIG. 1.

Reference is now made to FIG. 1 to FIG. 2, in which FIG. 1 is a side view of a circuit board device 10 according to one embodiment of the present disclosure, and FIG. 2 is a top view of an area M of FIG. 1. As shown in FIG. 1 to FIG. 2, the circuit board device 10 includes a multilayer structure 100, a main ground area 200 and a circuit module 300. The multilayer structure 100 includes a plurality of plates 110 which are stacked along a vertical direction V. A disposition surface 111 on a top surface of one of the plates 110 is made of insulating material, and a printed circuit pattern can be distributed on the insulating material of the disposition surface 111. The main ground area 200 is disposed in the multilayer structure 100. For example, the main ground area 200 is a copper foil grounding that is interposed in the plates 110 and extended along a plane direction H.

The circuit module 300 includes a differential signal circuit 400 and a surrounding circuit module 500. The differential signal circuit 400 is located in the multilayer structure 100, and the differential signal circuit 400 includes a positive (e.g., P electrode) signal portion 410 and a negative (e.g., N electrode) signal portion 420. The positive signal portion 410 includes a positive channel 411 and a positive signal pad 412. The positive channel 411 is penetrated through the multilayer structure 100, electrically connected to the positive signal pad 412, and used to be a communication path of positive signals in the vertical direction V. The positive signal pad 412 is directly installed on the disposition surface 111 of one of the plates 110, and penetrated through by one part of the positive channel 411. The negative signal portion 420 includes a negative channel 421 and a negative signal pad 422. The negative channel 421 is penetrated through the multilayer structure 100, electrically connected to the negative signal pad 422, and used to be a communication path of negative signals in the vertical direction V. The negative signal pad 422 is directly installed on the disposition surface 111 of one of the plates 110, and penetrated through by one part of the negative channel 421. The positive signal pad 412 and the negative signal pad 422 are located on the disposition surface 111 abreast, and physically separated from each other. The surrounding circuit module 500 is electrically connected to the main ground area 200, directly located on the disposition surface 111 to surround the positive signal pad 412 and the negative signal pad 422 in an enclosing way. The surrounding circuit module 500 is physically separated from the differential signal circuit 400, that is, the surrounding circuit module 500 is spaced apart from the positive signal pad 412 and the negative signal pad 422, respectively.

Thus, through the construction of the embodiments above, even if the thickness of the plates of the circuit board device in the disclosure is increased, input loss and loop loss failures of the signals still can be maintained or improved, thereby enhancing the signal performance of the signal channel.

In the embodiment, more specifically, the surrounding circuit module 500 includes a metal surrounding portion 510 that is singular in number. The metal surrounding portion 510 is formed on the disposition surface 111 to continuously surround and form a closed contour on the disposition surface 111. The closed contour is, for example, a circular ring or an elongated ring, however, the disclosure is not limited to the shapes of the closed contour. The metal surrounding portion 510 merely completely surrounds the positive signal pad 412 and the negative signal pad 422, rather than cover the positive signal pad 412 and the negative signal pad 422. For example, the metal surrounding portion 510 is a printed metal layer or a printed metal line, and a thickness of the metal surrounding portion 510 is micron-classed only, and the metal surrounding portion 510 is not a three-dimensional shield. The metal surrounding portion 510 continuously surrounds to define an elongated ring 511 enclosing an inner-ring space 514 therein. The metal surrounding portion 510 is electrically connected to the main ground area 200 located at its lower (or upper) layer through a route 515 (FIG. 1), and together surrounds both of the positive signal pad 412 and the negative signal pad 422 on the disposition surface 111. In other words, the positive signal pad 412 and the negative signal pad 422 are arranged together in the closed contour of the metal surrounding portion 510, and the positive signal pad 412 and the negative signal pad 422 are completely separated from the metal surrounding portion 510 without any direct or indirect contact. That is to say, a contour of the positive signal pad 412 and a contour of the negative signal pad 422 in the inner-ring space 514 are not touched by the elongated ring 511 of the metal surrounding portion 510 at all.

Furthermore, the circuit module 300 further includes a ground layer 600 and a plurality of peripheral ground-via portions 620. The ground layer 600 covers the disposition surface 111 of the plate 110 to completely surround the metal surrounding portion 510, the positive signal pad 412 and the negative signal pad 422. The peripheral ground-via portions 620 are separately arranged on the ground layer 600, and respectively penetrated through the ground layer 600 and the plates 110 (FIG. 1) so as to electrically connect to the grounding layer 600 and the main ground area 200. As a result the peripheral ground-via portions 620, the ground layer 600, the metal surrounding portion 510 and the main ground area 200 are electrically connected with each other. More specifically, the ground layer 600 is formed with a closed opening 610 which exposes the disposition surface 111. The metal surrounding portion 510, the positive signal pad 412 and the negative signal pad 422 are all located on the disposition surface 111 within the closed opening 610, and are physically separated from the ground layer 600, respectively.

It is noted, the differential signal circuit 400 and the surrounding circuit module 500 are both located on the disposition surface 111 of the same plate 110 that is interposed between the remaining plates 110, however, the disclosure is not limited thereto.

In addition, the performance of the signal channel mentioned above can be changed by fine-tuning characteristics of the metal surrounding portion 510, such as a coverage, a thickness and a distance between the electrode (positive/negative) signal pads in the design stage.

Figure 3B:
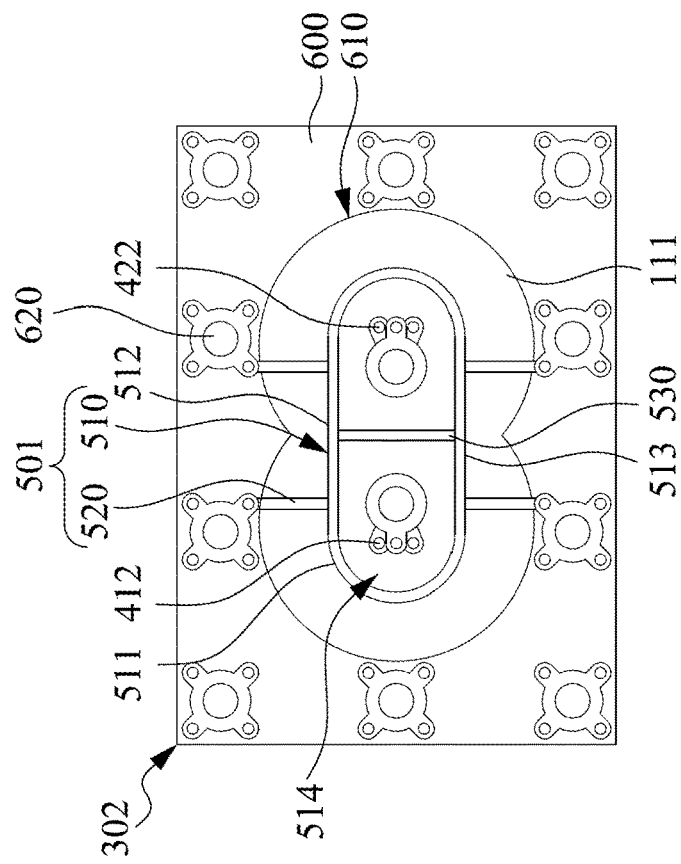
FIG. 3A and FIG. 3B are schematic views of circuit modules of a circuit board device according to some embodiments of the present disclosure, and their locations are the same as the area M in FIG. 1.
Figure 3A:
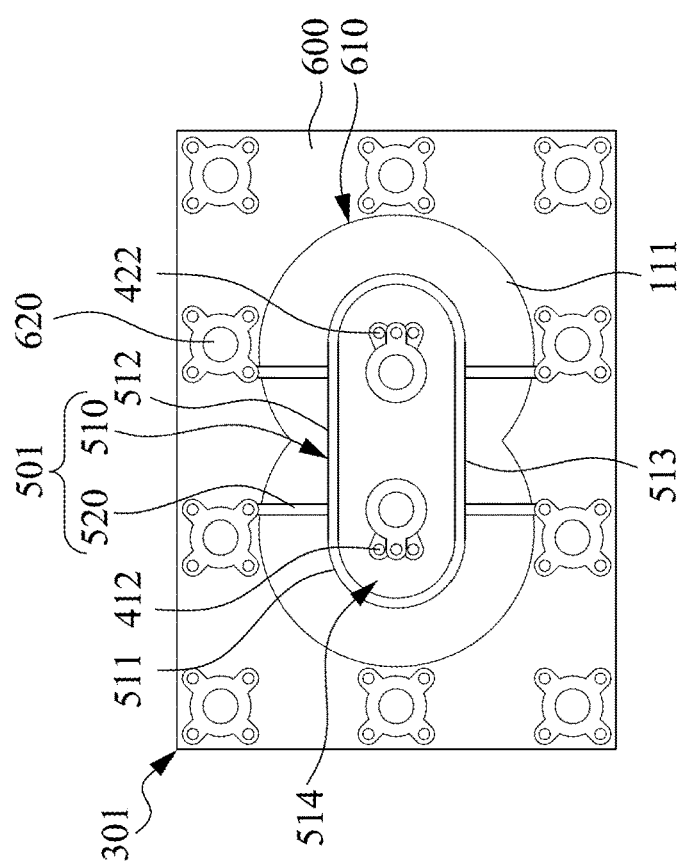

FIG. 3A and FIG. 3B are schematic views of circuit modules 301, 302 of a circuit board device 11 according to some embodiments of the present disclosure, and their locations are the same as the area M in FIG. 1. As shown in FIG. 1 and FIG. 3A, the circuit module 301 of the embodiment is substantially the same as the circuit module 300 of FIG. 2, except that the surrounding circuit module 501 further includes a plurality of first connecting wires 520 located on the disposition surface 111 within the closed opening 610, and arranged on the disposition surface 111 in a linear (or curved) way. Each of the first connecting wires 520 is physically connected to the metal surrounding portion 510 and one of the peripheral ground-via portions 620. However, the disclosure is not limited thereto, in another embodiment, the first connection wire can also be modified to physically connect to the metal surrounding portion 510 and the ground layer.

More specifically, the metal surrounding portion 510, for example is an elongated ring 511 enclosing an inner-ring space 514 therein. The first connecting wires 520 are located out of the inner-ring space 514 in which one part of the first connecting wires 520 is connected to one of long sides 512 of the elongated ring 511, and another part of the first connecting wires 520 is connected to the other long side 513 of the elongated ring 511. For example, the first connecting wires 520 respectively are printed metal layers or printed metal lines, and a thickness of each of the first connecting wires 520 is micron-classed only, and each of the first connecting wires 520 is not a three-dimensional shield, however, the disclosure is not limited thereto.

As shown in FIG. 1 and FIG. 3B, the circuit module 302 of the embodiment is substantially the same as the circuit module 301 of FIG. 3A, except that the surrounding circuit module 501 further includes a second connecting wire 530 connected to the metal surrounding portion 510 in the contour of the metal surrounding portion 510 and arranged between the positive signal pad 412 and the negative signal pad 422 so as to physically separate the positive signal pad 412 from the negative signal pad 422.

More specifically, the second connecting wire 530 is located in the inner-ring space 514 of the metal surrounding portion 510 and arranged linearly on one part of the disposition surface 111 in the inner-ring space 514. Two opposite ends of the second connecting wire 530 are respectively connected to two opposite long sides 512, 513 of the metal surrounding portion 510 so as to divide the inner-ring space 514 into two parts for completely isolating the positive signal pad 412 and the negative signal pad 422 individually. For example, the second connecting wire 530 is a printed metal layer or a printed metal line, and a thickness of the second connecting wire 530 is micron-classed only, and the second connecting wire 530 is not a three-dimensional shield, however, the disclosure is not limited thereto.

Figure 4B:
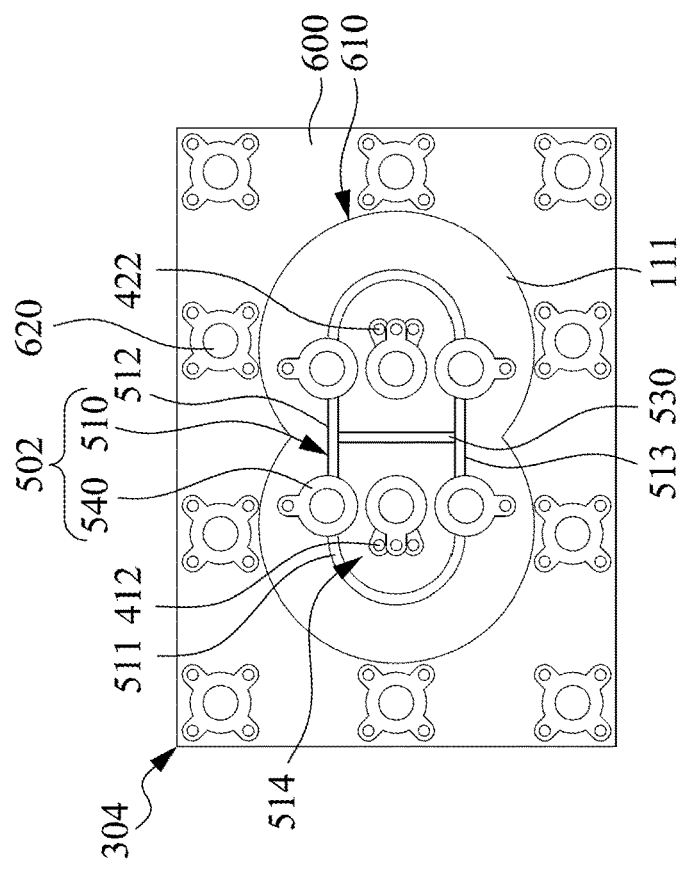
FIG. 4A and FIG. 4B are schematic views of circuit modules of a circuit board device according to some embodiments of the present disclosure, and their locations are the same as the area M in FIG. 1.
Figure 4A:
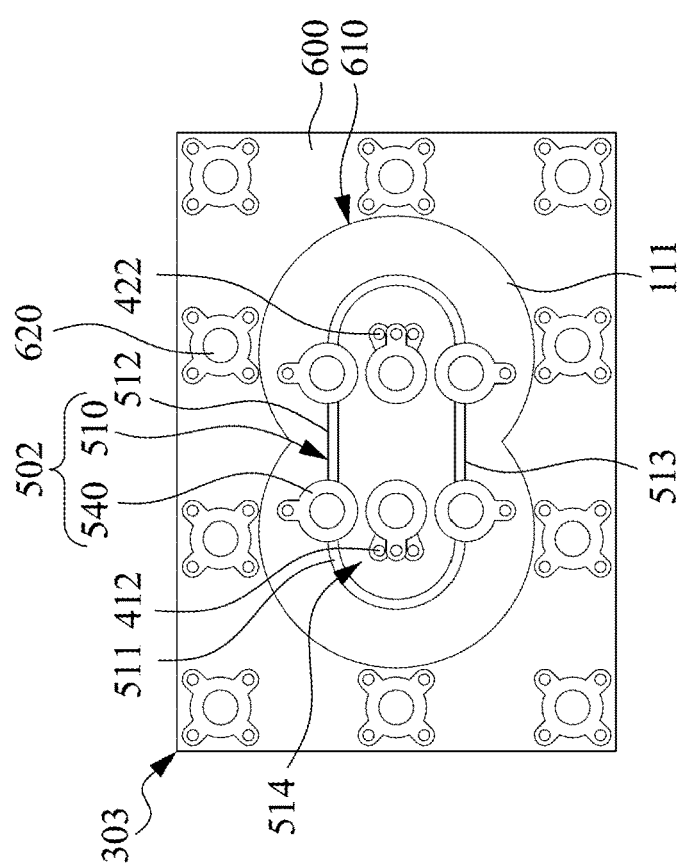

FIG. 4A and FIG. 4B are schematic views of circuit modules 303, 304 of a circuit board device 12 according to some embodiments of the present disclosure, and their locations are the same as the area M in FIG. 1. As shown in FIG. 1 and FIG. 4A, the circuit module 303 of the embodiment is substantially the same as the circuit module 300 of FIG. 2, except that the surrounding circuit module 502 further includes a plurality of ground via portions 540. The ground via portions 540 are formed on the metal surrounding portion 510 to be electrically conducted to the metal surrounding portion 510. Each of the ground via portions 540 is penetrated through the plate 110 (FIG. 1), and electrically connected to the main ground area 200 located at its lower (or upper) layer through a route (not shown).

More specifically, the metal surrounding portion 510, for example is an elongated ring 511 enclosing an inner-ring space 514 therein. The ground via portions 540 are symmetrically located on the metal surrounding portion 510. Namely, one part of the ground via portions 540 is formed on one of the long sides 512 of the elongated ring 511, and another part of the ground via portions 540 is formed on the other long side 513 of the elongated ring 511. A contour of the positive signal pad 412 and a contour of the negative signal pad 422 in the inner-ring space 514 are not touched by the ground via portions 540 at all, however, the disclosure is not limited thereto.

As shown in FIG. 1 and FIG. 4B, the circuit module 304 of the embodiment is substantially the same as the circuit module 303 of FIG. 4A, except that the surrounding circuit module 502 further includes a second connecting wire 530 connected to the metal surrounding portion 510 in the contour of the metal surrounding portion 510 and arranged between the positive signal pad 412 and the negative signal pad 422 and among the ground via portions 540 so as to physically separate the positive signal pad 412 from the negative signal pad 422.

More specifically, the second connecting wire 530 is located in the inner-ring space 514 of the metal surrounding portion 510, and arranged on one part of the disposition surface 111 in the inner-ring space 514 in a linear (or curved) way. Two opposite ends of the second connecting wire 530 are respectively connected to two opposite long sides 512, 513 of the metal surrounding portion 510 such that the inner-ring space 514 is divided into two parts by the second connecting wire 530 thereby completely isolating the positive signal pad 412 and the negative signal pad 422 individually. However, the disclosure is not limited thereto.

Figures 5A, 5B:
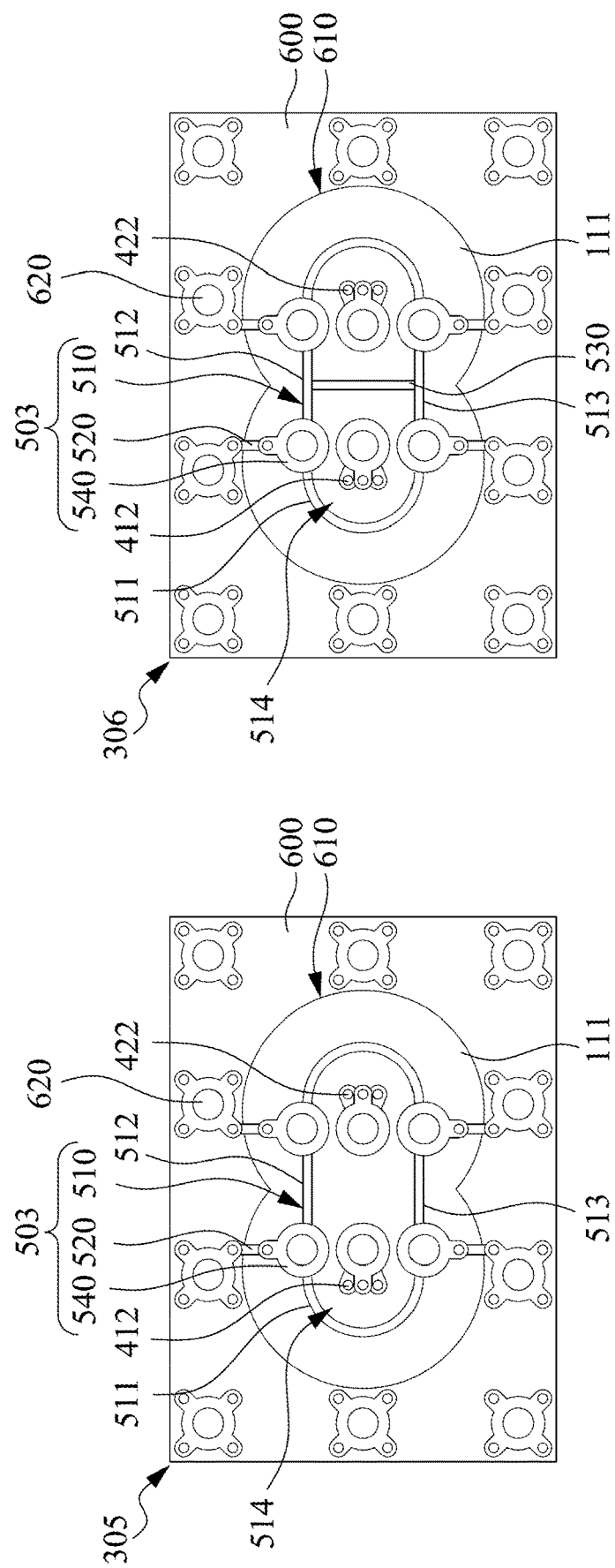
FIG. 5A and FIG. 5B are schematic views of circuit modules of a circuit board device according to some embodiments of the present disclosure, and their locations are the same as the area M in FIG. 1.

FIG. 5A and FIG. 5B are schematic views of circuit modules 305, 306 of a circuit board device 13 according to some embodiments of the present disclosure, and their locations are the same as the area M in FIG. 1. As shown in FIG. 1 and FIG. 5A, the circuit module 305 of the embodiment is substantially the same as the circuit module 303 of FIG. 4A, except that the surrounding circuit module 503 further includes a plurality of first connecting wires 520 located on the disposition surface 111 within the closed opening 610, and arranged on the disposition surface 111 in a linear (or curved) way. Each of the first connecting wires 520 is physically connected to one of the ground via portions 540 and one of the peripheral ground-via portions 620. However, the disclosure is not limited thereto, in another embodiment, the first connection wire can also be modified to physically connect to the metal surrounding portion and the ground layer. The first connecting wires 520 are located symmetrically within the closed opening 610. However, the disclosure is not limited thereto.

As shown in FIG. 1 and FIG. 5B, the circuit module 306 of the embodiment is substantially the same as the circuit module 305 of FIG. 5A, except that the surrounding circuit module 503 further includes a second connecting wire 530 connected to the metal surrounding portion 510 in the contour of the metal surrounding portion 510 and arranged between the positive signal pad 412 and the negative signal pad 422 and among the ground via portions 540 so as to physically separate the positive signal pad 412 from the negative signal pad 422. However, the disclosure is not limited thereto.

Figure 6A:
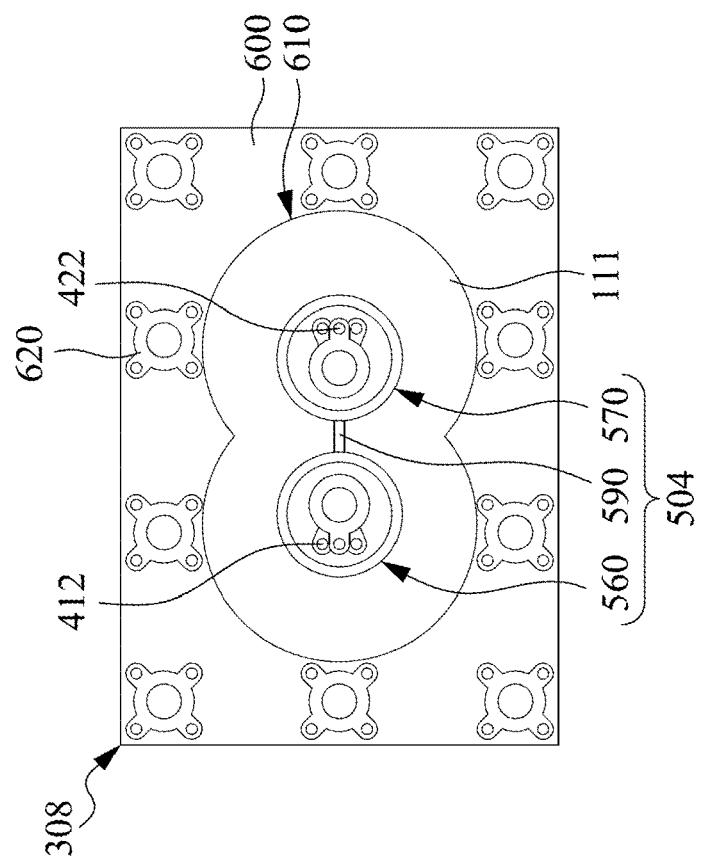
FIG. 6A and FIG. 6B are schematic views of circuit modules of a circuit board device according to some embodiments of the present disclosure, and their locations are the same as the area M in FIG. 1.
Figure 6B:
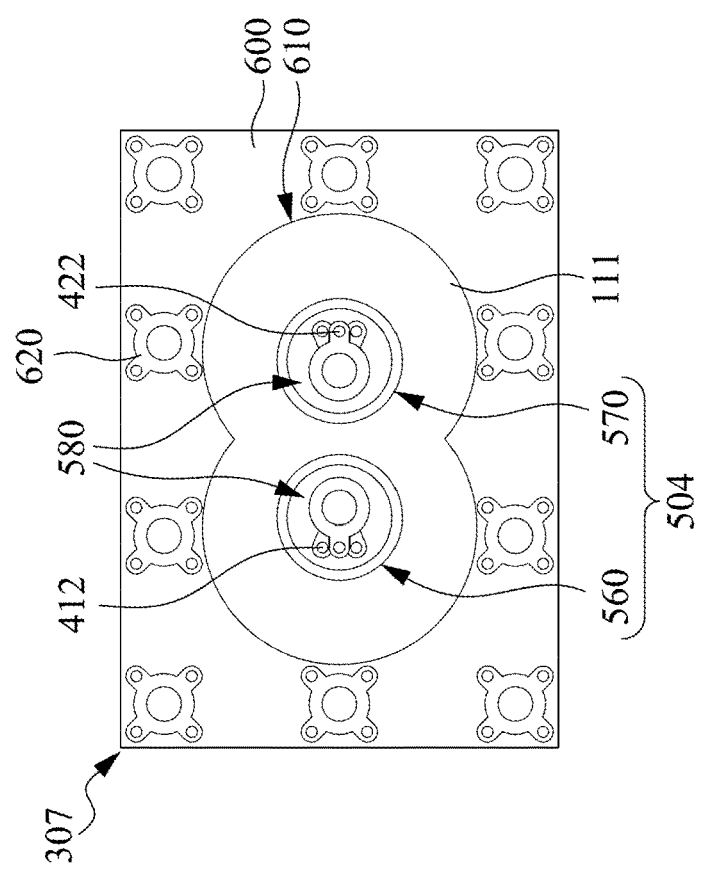

FIG. 6A and FIG. 6B are schematic views of circuit modules 307, 308 of a circuit board device 14 according to some embodiments of the present disclosure, and their locations are the same as the area M in FIG. 1. As shown in FIG. 1 and FIG. 6A, the circuit module 307 of the embodiment is substantially the same as the circuit module 300 of FIG. 2, except that the surrounding circuit module 504 further includes two metal surrounding portions (refer to first metal surrounding portion 560 and second metal surrounding portion 570 hereinafter) rather than the single metal surrounding portion mentioned above. The first metal surrounding portion 560 surrounds the positive signal pad 412 in an enclosing way, and the first metal surrounding portion 560 is physically separated from the positive signal pad 412. The first metal surrounding portion 560 is electrically connected to the main ground area 200 (FIG. 1). The second metal surrounding portion 570 surrounds the negative signal pad 422 in an enclosing way, and the second metal surrounding portion 570 is physically separated from the negative signal pad 422. The second metal surrounding portion 570 is electrically connected to the main ground area 200 (FIG. 1). The first metal surrounding portion 560 and the second metal surrounding portion 570 are separated from each other.

More specifically, the first metal surrounding portion 560 is formed on one part of the disposition surface 111 exposed outwards from the closed opening 610 to continuously surround and form a closed contour. The closed contour is, for example, a circular ring, however, the disclosure is not limited to the shapes of the closed contour. For example, the first metal surrounding portion 560 is a printed metal layer or a printed metal line, and a thickness of the first metal surrounding portion 560 is micron-classed only, and the first metal surrounding portion 560 is not a three-dimensional shield. The first metal surrounding portion 560 continuously surrounds to define a circular ring completely enclosing a circular space 580 therein. The first metal surrounding portion 560 is electrically connected to the main ground area 200 located at its lower (or upper) layer through a route (not shown), and surrounds the positive signal pad 412 on the disposition surface 111, on the other words, the positive signal pad 412 is totally located within the circular space 580, and the circular space 580 is completely separated from the positive signal pad 412 without any direct or indirect contact. That is to say, a contour of the positive signal pad 412 in the circular space 580 is not touched by the circular ring of the first metal surrounding portion 560 at all. The second metal surrounding portion 570 is the same as the first metal surrounding portion 560, which is electrically connected to the main ground area 200 located at its lower (or upper) layer through another route (not shown) and surrounds the negative signal pad 422 on the disposition surface 111, thus, the details of the second metal surrounding portion 570 are not described repeatedly again. In this way, the positive signal pad 412 and the negative signal pad 422 are respectively completely closed.

As shown in FIG. 1 and FIG. 6B, the circuit module 308 of the embodiment is substantially the same as the circuit module 307 of FIG. 6A, except that the surrounding circuit module 504 further includes a third connecting wire 590. The third connecting wire 590 is located within the closed opening 610, out of the first metal surrounding portion 560 and the second metal surrounding portion 570, and located between the first metal surrounding portion 560 and the second metal surrounding portion 570 to directly connect to the first metal surrounding portion 560 and the second metal surrounding portion 570. For example, the third connecting wire 590 is a printed metal layer or a printed metal line, and a thickness of the third connecting wire 590 is micron-classed only, and the third connecting wire 590 is not a three-dimensional shield. However, the disclosure is not limited thereto.

Figure 7A:
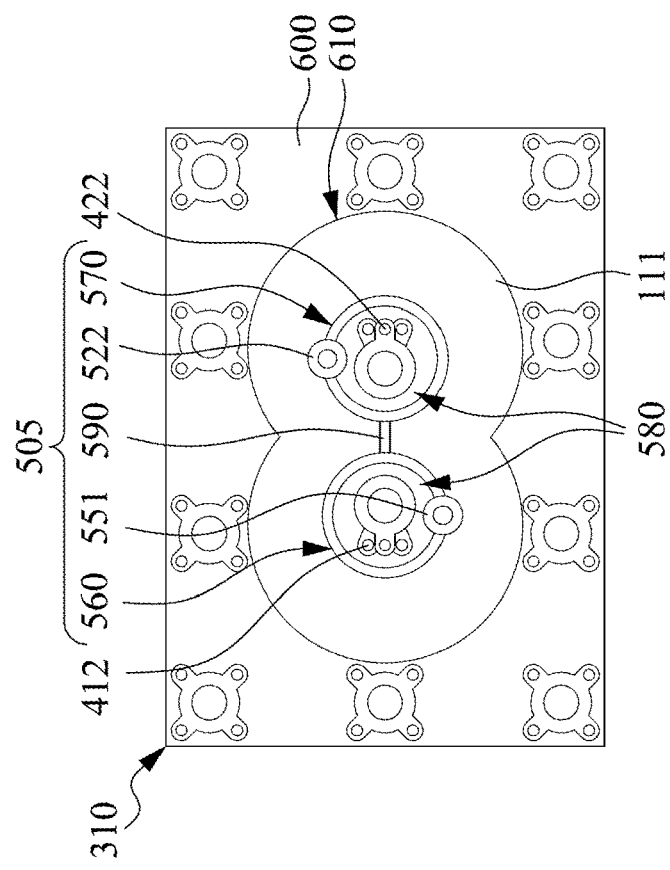
FIG. 7A and FIG. 7B are schematic views of circuit modules of a circuit board device according to some embodiments of the present disclosure, and their locations are the same as the area M in FIG. 1.
Figure 7B:
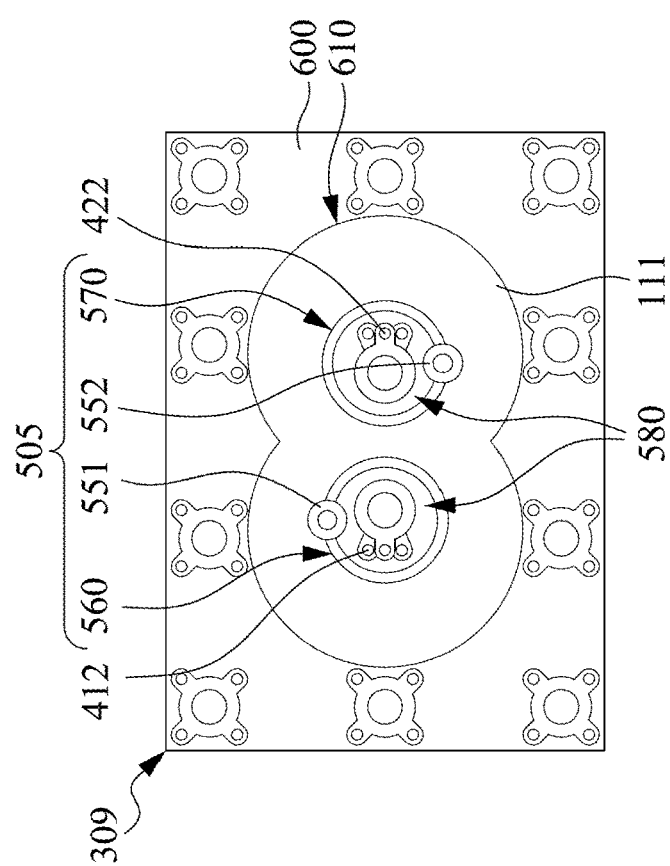

FIG. 7A and FIG. 7B are schematic views of circuit modules 309, 310 of a circuit board device 15 according to some embodiments of the present disclosure, and their locations are the same as the area M in FIG. 1. As shown in FIG. 1 and FIG. 7A, the circuit module 309 of the embodiment is substantially the same as the circuit module 307 of FIG. 6A, except that the surrounding circuit module 505 further includes at least one first ground via portion 551 and at least one second ground via portion 552. The first ground via portion 551 is disposed on the first metal surrounding portion 560 and electrically conducted to the first metal surrounding portion 560. The first ground via portion 551 is further penetrated through the plate 110 to be electrically connected to the main ground area 200 (FIG. 1). The second ground via portion 552 is disposed on the second metal surrounding portion 570 and electrically conducted to the second metal surrounding portion 570. The second ground via portion 552 is further penetrated through the plate 110 to be electrically connected to the main ground area 200 (FIG. 1).

As shown in FIG. 1 and FIG. 7B, the circuit module 310 of the embodiment is substantially the same as the circuit module 309 of FIG. 7A, except that the surrounding circuit module 505 further includes a third connecting wire 590. The third connecting wire 590 is located out of the first metal surrounding portion 560 and the second metal surrounding portion 570, and directly connected to the first metal surrounding portion 560 and the second metal surrounding portion 570. However, the disclosure is not limited thereto, in another embodiment, the first metal surrounding portion 560 and the second metal surrounding portion 570 can be modified to be directly contacted with each other. For example, the third connecting wire 590 is a printed metal layer or a printed metal line, and a thickness of the third connecting wire 590 is micron-classed only, and the third connecting wire 590 is not a three-dimensional shield. However, the disclosure is not limited thereto.

Figure 8B:
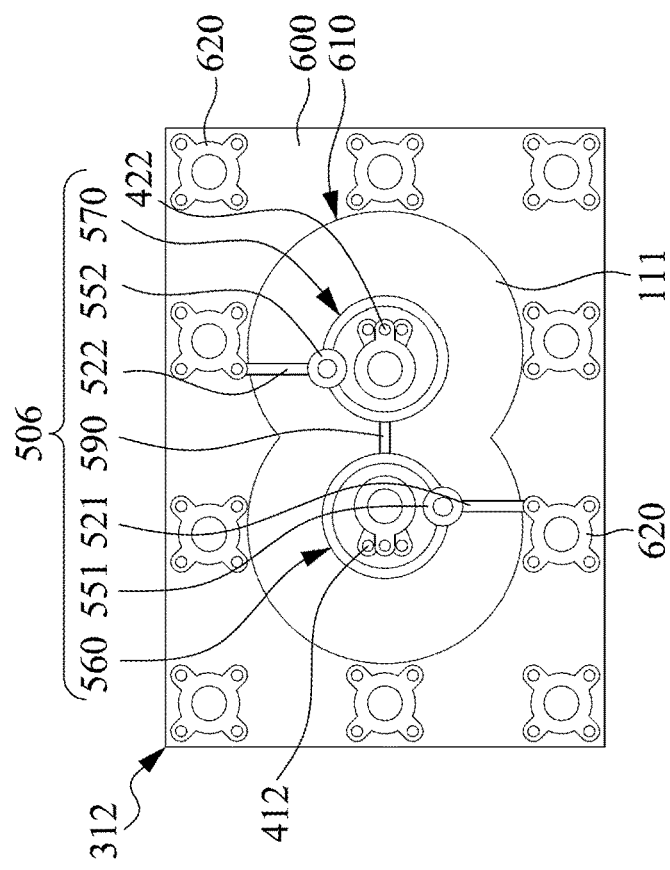
FIG. 8A and FIG. 8B are schematic views of circuit modules of a circuit board device according to some embodiments of the present disclosure, and their locations are the same as the area M in FIG. 1.
Figure 8A:
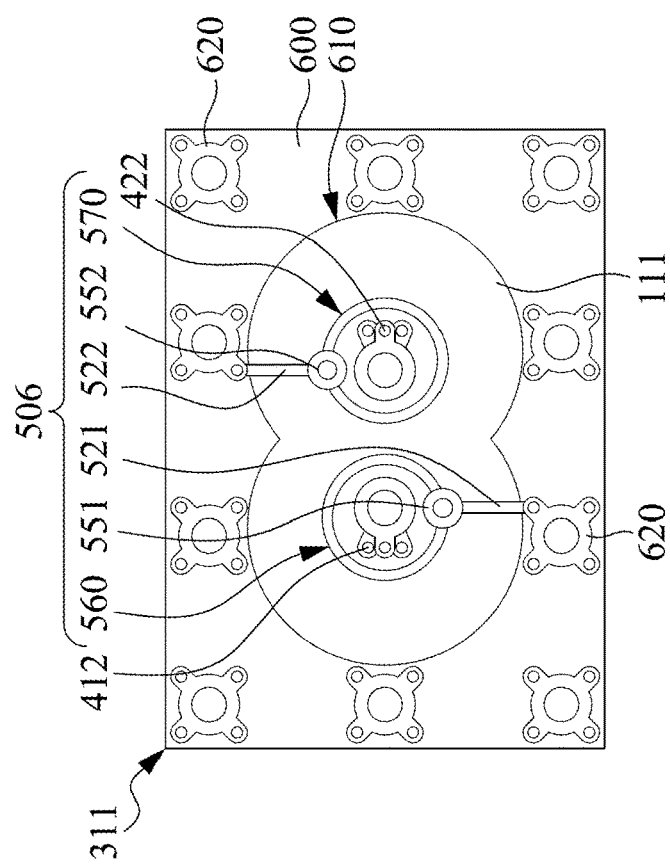

FIG. 8A and FIG. 8B are schematic views of circuit modules 311, 312 of a circuit board device 16 according to some embodiments of the present disclosure, and their locations are the same as the area M in FIG. 1. As shown in FIG. 1 and FIG. 8A, the circuit module 311 of the embodiment is substantially the same as the circuit module 309 of FIG. 6A, except that the surrounding circuit module 506 further includes a first trace 521 and a second trace 522. The first trace 521 is arranged on the disposition surface 111 within the closed opening 610 in a linear (or curved) way, and physically connected to the first ground via portion 551 and one of the peripheral ground-via portions 620. The second trace 522 is arranged on the disposition surface 111 within the closed opening 610 in a linear (or curved) way, and physically connected to the second ground via portion 552 and one of the peripheral ground-via portions 620. However, the present disclosure is not limited thereto. In another embodiment, the first trace 521 can also be modified to physically connect to the first ground via portion and the ground layer, and the second trace 522 can also be modified to physically connect to the second ground via portion and the ground layer.

As shown in FIG. 1 and FIG. 8B, the circuit module 312 of the embodiment is substantially the same as the circuit module 311 of FIG. 8A, except that the surrounding circuit module 506 further includes a third connecting wire 590. The third connecting wire 590 is located out of the first metal surrounding portion 560 and the second metal surrounding portion 570, and directly connected to the first metal surrounding portion 560 and the second metal surrounding portion 570. For example, the third connecting wire 590 is a printed metal layer or a printed metal line, and a thickness of the third connecting wire 590 is micron-classed only, and the third connecting wire 590 is not a three-dimensional shield. However, the disclosure is not limited thereto, in another embodiment, the first metal surrounding portion 560 and the second metal surrounding portion 570 can be modified to be directly contacted with each other.

Figure 9:
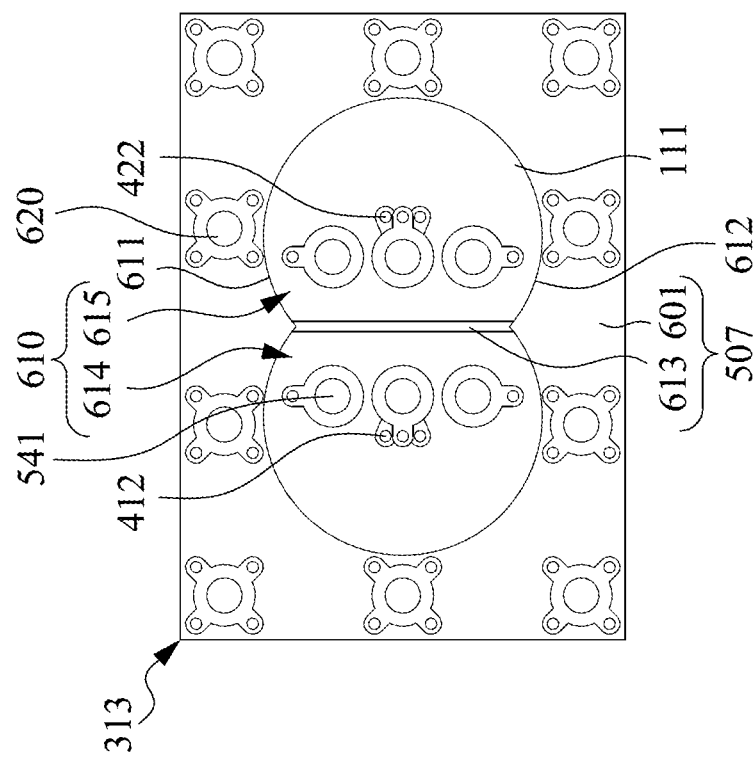
FIG. 9 is a schematic view of a circuit module of a circuit board device according to one embodiment of the present disclosure, and its location is the same as the area M in FIG. 1.

FIG. 9 is a schematic view of a circuit module 313 of a circuit board device 17 according to one embodiment of the present disclosure, and its location is the same as the area M in FIG. 1. As shown in FIG. 1 and FIG. 9, the circuit module 313 of the embodiment is substantially the same as the circuit module 309 of FIG. 2, except that the surrounding circuit module 507 further includes a ground layer 601 and a separating trace 613. By the configuration of the ground layer 601 and the separating trace 613, not the elongated ring (FIG. 2) nor double circular rings (FIG. 6A), the positive signal pad 412 and the negative signal pad 422 are surrounded in an enclosing way, respectively.

More specifically, both of the positive signal pad 412 and the negative signal pad 422 are collectively located within a contour of the closed opening 610. The separating trace 613 is located on the disposition surface 111 within the closed opening 610, located between the positive signal pad 412 and the negative signal pad 422, and connected to two opposite inner sides of the closed opening 610. The closed opening 610 is divided into two closed areas 614, 615 by the separating trace 613, and the positive signal pad 412 and the negative signal pad 422 are accommodated in the closed areas 614, 615, respectively. The separating trace 613 physically separates the positive signal pad 412 and the negative signal pad 422, respectively without directly contacting the positive signal pad 412 and the negative signal pad 422. It is noted, each of the ground layer 601 and the separating trace 613, for example, is a printed metal layer or a printed metal line, and which thickness is micron-classed only, not a three-dimensional shield. Also, in this embodiment, a plurality of ground via portions 541 are further formed on the disposition surface 111 within the closed opening 610.

However, the disclosure is not limited thereto, in another embodiment, a trace (not shown in figures) can be also be placed on the disposition surface 111 within the closed opening 610 for physically connecting to the ground layer 601 and the ground via portions 541 in the closed opening 610.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A circuit board device, comprising:
    a multilayer structure comprising a plurality of plates stacked with each other;
    a main ground area arranged in the multilayer structure; and
    a circuit module, comprising:
        a differential signal circuit located in the multilayer structure, and comprising a positive signal portion having a positive signal pad, and a negative signal portion having a negative signal pad, the positive signal pad that is located on a disposition surface of one of the plates, and the negative signal pad that is located on the disposition surface, and separated from the positive signal pad; and
        a surrounding circuit module electrically connected to the main ground area, located on the disposition surface to surround the positive signal pad and the negative signal pad in an enclosing way, and the surrounding circuit module being physically separated from the differential signal circuit.

2. The circuit board device of claim 1, wherein the surrounding circuit module comprises a metal surrounding portion disposed on the disposition surface to continuously surround and form a closed contour on the disposition surface, and the metal surrounding portion is electrically connected to the main ground area, and the metal surrounding portion collectively surrounds the positive signal pad and the negative signal pad.

3. The circuit board device of claim 2, wherein the surrounding circuit module further comprises at least one ground via portion disposed on the metal surrounding portion and the plates and electrically connected to the main ground area.

4. The circuit board device of claim 2, wherein the surrounding circuit module further comprises a connecting wire located in the metal surrounding portion, and arranged between the positive signal pad and the negative signal pad, and the connecting wire is physically separated from the positive signal pad and the negative signal pad.

5. The circuit board device of claim 4, wherein the surrounding circuit module further comprises at least one ground via portion disposed on the metal surrounding portion and the plates and electrically connected to the main ground area.

6. The circuit board device of claim 1, wherein the surrounding circuit module further comprises:
    a first metal surrounding portion surrounding the positive signal pad in an enclosing way to be physically separated from the positive signal pad, and electrically connected to the main ground area; and
    a second metal surrounding portion surrounding the negative signal pad in an enclosing way to be physically separated from the negative signal pad, and electrically connected to the main ground area,
    wherein the first metal surrounding portion and the second metal surrounding portion are connected to or separated from each other.

7. The circuit board device of claim 6, wherein the surrounding circuit module further comprises:
    at least one first ground via portion disposed on the first metal surrounding portion and the plates, and electrically connected to the first metal surrounding portion and the main ground area; and
    at least one second ground via portion disposed on the second metal surrounding portion and the plates, and electrically connected to the second metal surrounding portion and the main ground area.

8. The circuit board device of claim 6, wherein the surrounding circuit module further comprises a connecting wire located out of the first metal surrounding portion and the second metal surrounding portion to be directly connected to the first metal surrounding portion and the second metal surrounding portion.

9. The circuit board device of claim 8, wherein the surrounding circuit module further comprises:
    at least one first ground via portion disposed on the first metal surrounding portion and the plates, and electrically connected to the first metal surrounding portion and the main ground area; and
    at least one second ground via portion disposed on the second metal surrounding portion and the plates, and electrically connected to the second metal surrounding portion and the main ground area.

10. The circuit board device of claim 1, wherein the circuit module further comprises:
    a ground layer covering the disposition surface of the one of the plates to surround the surrounding circuit module, the positive signal pad and the negative signal pad, wherein the ground layer is formed with a closed opening which exposes the disposition surface; and
    at least one peripheral ground-via portion penetrated through the ground layer and the plates, and electrically connected to the grounding layer and the main ground area, wherein the surrounding circuit module, the positive signal pad and the negative signal pad are located within the closed opening, and physically separated from the ground layer.

11. The circuit board device of claim 10, wherein the surrounding circuit module further comprises a connecting wire, one end of the connecting wire is conducted to the surrounding circuit module, another end of the connecting wire is conducted to one of the peripheral ground-via portion and the ground layer.

12. The circuit board device of claim 1, wherein the surrounding circuit module further comprises:
- a ground layer disposed on the disposition surface of the one of the plates to surround the positive signal pad and the negative signal pad in an enclosing way, wherein the ground layer is formed with a closed opening which exposes the disposition surface, and the positive signal pad and the negative signal pad are collectively located within a contour of the closed opening; and
- a separating trace located on the disposition surface within the closed opening to connect two opposite inner sides of the closed opening, and arranged between the positive signal pad and the negative signal pad, wherein the closed opening is divided into two closed areas by the separating trace, the positive signal pad and the negative signal pad are accommodated in the closed areas, respectively, and the separating trace physically separates the positive signal pad and the negative signal pad respectively.

\* \* \* \* \*